United States Patent
Xu

(10) Patent No.: US 6,714,081 B1
(45) Date of Patent: Mar. 30, 2004

(54) ACTIVE CURRENT BIAS NETWORK FOR COMPENSATING HOT-CARRIER INJECTION INDUCED BIAS DRIFT

(75) Inventor: Jie Xu, Chandler, AZ (US)

(73) Assignee: Motorola, Inc., Schamburg, IL (US)

( * ) Notice: Subject to any disclaimer, the term of this patent is extended or adjusted under 35 U.S.C. 154(b) by 0 days.

(21) Appl. No.: 10/241,081

(22) Filed: Sep. 11, 2002

(51) Int. Cl.$^7$ ................................................. H03F 3/04
(52) U.S. Cl. ...................... 330/296; 330/288; 323/315
(58) Field of Search ................................ 330/296, 288, 330/290; 323/315, 316

(56) References Cited

U.S. PATENT DOCUMENTS

| | | | |
|---|---|---|---|
| 3,714,601 A | 1/1973 | Minton et al. | 330/279 |
| 4,933,645 A | 6/1990 | Kasai et al. | 330/255 |
| 5,469,111 A | 11/1995 | Chiu et al. | 327/538 |
| 6,043,714 A | * 3/2000 | Yamamoto et al. | 330/296 |
| 6,064,268 A | * 5/2000 | Felps | 330/288 |
| 6,134,060 A | 10/2000 | Ryat et al. | 360/46 |
| 6,300,837 B1 | * 10/2001 | Sowlati et al. | 330/296 |
| 6,046,642 A1 | 4/2002 | Bratyon et al. | 330/296 |

* cited by examiner

Primary Examiner—Henry Choe
(74) Attorney, Agent, or Firm—Steptoe & Johnson LLP; Tyson Y. Winarski

(57) ABSTRACT

An active current bias network that compensates for Hot-Carrier Injection (HCI) induced bias drift, a common phenomenon existing in Metal-Oxide Semiconductor (MOS) transistors and especially in Laterally Diffused MOS (LDMOS) transistors. The active bias network of the present invention first senses the bias current flowing in the targeted transistor and then compares the bias current in the targeted transistor with a stable reference current. The difference between the bias current in the targeted transistor and the reference current is then utilized to adjust the bias of the targeted transistor via a current mirror feedback circuit. The bias current of the targeted transistor then is stable independent of any HCI induced bias changes and changes due to other adverse causes. The sensing MOS transistor used for monitoring bias current is operated in the triode region and has minimum effect on the performance of the targeted transistor.

11 Claims, 1 Drawing Sheet

ACTIVE CURRENT BIAS NETWORK FOR COMPENSATING HOT-CARRIER INJECTION INDUCED BIAS DRIFT

TECHNICAL FIELD OF THE INVENTION

The present invention relates to techniques for biasing amplification transistors, and in particular, techniques designed to adjust the bias current to compensate for induced bias drift caused by temperature and hot-carrier injection.

BACKGROUND OF THE INVENTION

In amplification circuits, it is highly desirable for amplification transistors to have a stable bias current in order to maintain a particular level of performance. Deviations from a particular bias current level degrades the overall performance of the amplification transistor. In particular, deviation from the original quiescent current point degrades the gain performance of the amplification circuit. Bias current drift also increases the signal distortion and degrades the linear performance of the transistor. In applications such as cellular base stations that utilize the amplification circuit, any significant performance degradation in the amplification transistors inhibits the ability of the base station to function.

There are a number of phenomena that will cause the bias current in the amplification transistor to drift. Variations in temperature will cause short term drift in the bias current. In addition, variations in the power supply will cause short term drift. Long term drift in the bias current is caused by Hot Carrier Injection (HCI).

HCI induced bias drift is a phenomenon that degrades the performance of Metal-Oxide Semiconductor (MOS) transistors and Laterally Diffused MOS transistors (LDMOS) in particular. The term hot carriers refers to carriers that arc highly energetic. When an electric field is applied across the source and drain of the MOS device, carriers become accelerated and undergo drift. Typically, most of these electrons will experience one or more scattering events when undergoing transport in the channel between the source and drain. However, as MOS devices are reduced in scale and the distance between the source and drain is decreased, more and more carriers travel from the source to the drain while experiencing fewer and fewer scattering events. These carriers that fail to encounter as many scattering events then become highly energetic and cause Hot Carrier Injection (HCI) in the source and drain. The HCI effect causes the bias current to drift away from a desired quiescent point. This drift of the quiescent current is highly undesirable. Under the HCI effect, the level of bias current can drift to either a higher level or a lower level of current. In addition, the HCI effect causes the bias current to drift away from its initial setting up to 20 percent at a constant power supply condition.

For a reliable operation of the base stations, all devices used in the station should sustain a satisfactory performance for at least twenty years. To provide this twenty year period of satisfactory performance, solutions have evolved to keep the quiescent point of the amplification transistor stable independent of temperature, power supply variations, and HCI. One of these techniques is to use an active bias network, which is a closed loop control system. The active bias network regulates the flow of bias current in particular transistor, referred to as the "targeted" transistor, by simulating the behavior of the targeted transistor with an external circuit. The external circuit simulates the behavior of the targeted transistor with a reference transistor that is a scaled replica of the targeted transistor. Through making the reference transistor a scaled replica of the targeted transistor, it is possible to replicate the variations in the bias current in the targeted transistor caused by HCI, temperature fluctuations, and power supply variations in the reference transistor.

The current variations in the reference transistor, which are proportional to the current variations in the targeted transistor, are detected by a current sensing circuit. When the active bias network detects a bias change in the reference transistor, which is indicative of the bias change in the targeted transistor, the circuit provides a corrective feedback to both the targeted and reference transistors to restore them both to providing the desired level of bias current.

There are two basic techniques employed to sense bias current changes in the reference transistor. Bias variations are detected through sensing either voltage or current changes in the reference transistor. With either technique, a primary concern is creating a bias current sensor that does not prevent the reference transistor from accurately simulating the targeted transistor. For the reference transistor to accurately simulate the operation of the targeted transistor, it is necessary for the reference transistor to have the same design ratio and the same voltage loading as the targeted transistor. The HCI effect in MOS transistors is related to several factors including gate oxide degradation, process induced damage, and a high electric field concentration in the channel between the source and drain in the MOS device. If the reference transistor has a different voltage loading than the targeted transistor, the reference transistor will have a different amount of electric field concentration in the channel and a different level of HCI and react differently to temperature and power supply fluctuations. Consequently, the reference transistor will not accurately replicate the function of the targeted transistor, thereby preventing the active bias network from properly stabilizing the targeted transistor at a specified current level.

Designing a reference transistor with a design ratio identical to the targeted transistor is a straight forward matter. However, designing a bias current sensor that minimizes the "headroom effect" is a more complex problem. The headroom effect refers to the voltage loading across the sensing device that is connected to the reference transistor. Both the reference transistor and the targeted transistor are connected to the same power supply. If there is zero voltage drop across the current sensing device, then the voltage drop across the reference transistor is identical to the voltage drop across the targeted transistor. As a result, the reference transistor precisely simulates the operation of the targeted transistor. However, when the current sensing device begins to consume voltage and reduce the loading across the reference transistor, the performance of the reference transistor begins to deviate from the targeted transistor. When the current sensor takes a portion of the loading that would preferably fall across the reference transistor, the current sensor begins to occupy "headroom." The performance of the active bias network is maximized when the headroom effect is minimized.

The active bias method disclosed in the U.S. Pat. No. 6,046,642 issued to Brayton et al. utilizes a resistor to sense the level of current flowing through the monitored reference transistor. Voltage changes across this sensing resistor indicate bias current changes occurring in the reference and targeted transistors. The active bias system in the U.S. Pat. No. 6,042,642 patent uses this sensed information to provide feedback to the monitored transistor and restore the bias current to its desired level.

The use of a sense resistor to monitor the level of current flowing from the reference transistor has numerous implications for the effectiveness for the active bias network. The use of a sense resistor directly impacts the loading on the reference transistor. It is desirable to use a large sense resistor to detect the current flowing in the reference transistor because of the relatively small amount of circuitry needed to monitor the level of current. However, the use of a large sense resistor to detect the bias current from the reference transistor produces a large voltage drop across the sense resistor. The size of this voltage drop is as large as two Volts. Consequently, the use of a large sense resistor makes the loading across the reference transistor different from the targeted transistor. When a transistor may only have a turn on voltage of two volts, the presence of the sensing resistor with a loading of two volts greatly disturbs the ability of the reference transistor to replicate the functions of the targeted transistor. As a result, the reference transistor does not precisely emulate the current variations in the targeted transistor due to temperature, power fluctuations, and HCI.

One solution to this loading problem is to use a small resistor as a current sensor. A small resistor has a small voltage drop that enables the reference transistor to closely emulate the targeted transistor. However, a small sense resistor has the disadvantage of requiring a large circuit to detect the small voltage drop across the small sense resistor. This large circuit consumes a large amount of chip space and requires a significant amount of design time to properly implement.

It is also possible to implement an active bias network utilizing current mirrors to sense and control bias current in the reference and targeted transistors. A current mirror in its most basic form consists of a transistor pair that produces a controlled current flowing in a transistor that is a multiple of a reference current flowing in the other transistor. The two transistors in the current mirror will carry the same level of current if they share the same dimensions and the same gate/drain bias voltages.

The current mirrors used in active bias networks known to the art have the transistor pair of the current mirror operating in the saturation region. In order to place the transistor pair into the saturation region, it is necessary to place a bias of $V_{DS}$ across the drain/source terminals of the transistors. Typically $V_{DS}$ is on the order of 2 volts.

As noted earlier, for the reference transistor to duplicate any HCI induced bias drift in the targeted transistor, it is necessary to keep similar drain/source bias voltages across the two transistors. However, with the transistor pair requiring a bias voltage of approximately .2 volts, at least 2 volts or more of voltage headroom is needed to bias the reference transistor. For a fixed voltage supply, the headroom occupied by the current mirror causes a 2 volt or more source/drain bias difference between the reference transistor and the targeted transistor. Since the current mirror alters the bias across the reference transistor, the electric field in the channel of the reference transistor is different from the targeted transistor. As a result, the reference transistor has a different level of HCI than the targeted transistor preventing the reference transistor from accurately simulating the targeted transistor.

The cause for this inability of the reference transistor to accurately simulate the targeted transistor is the headroom occupied by the current mirror. Consequently, there is a need to develop a new active bias network that can monitor and correct bias current changes in a targeted transistor more accurately while minimizing the headroom effect and minimizing the amount of circuitry used.

SUMMARY OF THE INVENTION

The present invention is for an active current bias network that compensates for Hot-Carrier Injection (HCI) induced bias drift, a common phenomenon existing in Metal-Oxide Semiconductor (MOS) transistors and especially in Laterally Diffused MOS (LDMOS) transistors. The active bias network of the present invention first senses the bias current flowing in the targeted transistor and then compares the bias current in the targeted transistor with a stable reference current. The difference between the bias current in the targeted transistor and the reference current is then utilized to adjust the bias of the targeted transistor via a current mirror feedback circuit.

The bias current of the targeted transistor then is stable independent of any HCI induced bias changes and changes due to other adverse causes. The sensing MOS transistor used for monitoring bias current is operated in the triode region and has minimum effect on the performance of the targeted transistor.

The present invention is also applicable to bias devices manufactured by other technologies like Bipolar Junction Transistors (BJT), Hetero-Junction Bipolar Transistors (HBT), Metal Semiconductor Field Effect Transistors (MESFET) and High Electron Mobility Transistors (HEMT). In addition, the present invention can be implemented in monolithic circuitry on the microchip or in discrete circuitry external of the microchip.

DETAILED DESCRIPTION OF A PREFERRED EMBODIMENT

Figure 1:
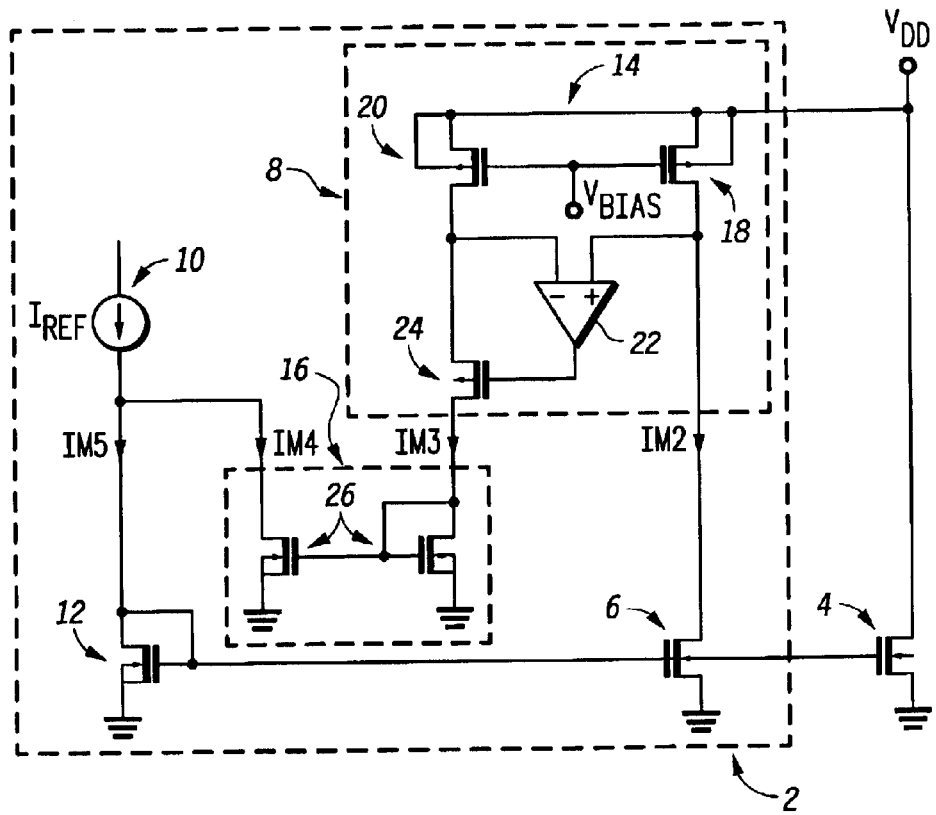
FIG. 1 illustrates a preferred embodiment of the present invention.

FIG. 1 illustrates a preferred embodiment of the present invention. The present invention is an active current bias network 2 that stabilizes the bias current in a targeted transistor 4 at a constant value. Active bias network 2 includes a reference transistor 6, a current sensor 8, a reference current source 10, and a feedback control 12. Together, these components of active bias network 2 function to stabilize the level of the bias current in targeted transistor 4 at a constant level. Active current bias network 2 senses the bias current flowing in targeted transistor 4 through current sensor 8, compares the bias current in targeted transistor 4 with the stable reference current from current source 10, and the difference in current found in the comparison is fed back via feedback control 12 to adjust the bias of targeted transistor 4.

There are a number of phenomena that will cause the bias current in targeted transistor 4 to deviate from a constant level. Temperature fluctuations will induce short term variations in the bias current in targeted transistor 4. Variations in the amount of power supplied to targeted transistor 4 will also induce variations in the bias current in targeted transistor 4. A phenomena that will cause long term variation in the bias current of targeted transistor 4 is Hot Carrier Injection (HCI). Over the long term, HCI will cause the bias current in targeted transistor 4 to monotonically stray from the desired stable constant value. HCI can cause the bias current in targeted transistor 4 to either increase or decrease monotonically. In addition, the HCI effect causes the bias current to drift away from its initial setting up to 20 percent at a constant power supply condition. In addition, there are also other phenomena that cause variations in the bias current of targeted transistor 4.

Active bias current network 2 compensates for the variations in the bias current caused by HCI and other effects. Active bias current network 2 compensates for these variations through comparing the bias current in the targeted device to a reference current source 10. Based upon this comparison, active bias current network 2 provides corrective feedback to targeted transistor 4 through feedback control 12.

Active bias current network 2 regulates the bias current in targeted transistor 4 through simulating the operation of targeted transistor 4 with reference transistor 6. Reference transistor 6 is a scaled replica of targeted transistor 4. Targeted transistor 4 is relatively large when compared to reference transistor 6. In a preferred embodiment, reference transistor 6 is a 300 $\mu$m device and targeted transistor 4 is a 10 or 100 mm device. The reason for this size difference is that targeted transistor 4 handles actual power loads while reference transistor 6 is merely used to simulate targeted transistor 4.

Reference transistor 6 simulates that bias current drift in targeted transistor 4. Since, reference transistor 6 is located close to targeted transistor 4, reference transistor 6 shows similar characteristics with bias current drift with targeted transistor 4 in terms of HCI, temperature variations, and power supply variations. In order for reference transistor 6 to duplicate any HCI induced bias drift in targeted transistor 4, the difference between the source/drain voltages of reference transistor 6 and targeted transistor 4 is minimized.

The amount of HCI in transistors 4 and 6 is based upon the level of the electric field in the device. In the present embodiment shown, MOS transistors are used. When transistor 4 and 6 have similar source/drain voltages placed across them, they will have similar electric fields in the MOS channel, and exhibit similar levels of HCI.

Active bias current network 2 uses current sensor 8 to monitor the bias current in reference transistor 6, which is proportional to the bias current in targeted transistor 4. Current sensor 8 includes two current mirrors, 14 and 16. A current mirror in its most basic form consists of a transistor pair that produces a controlled current flowing in a transistor that is a multiple of a reference current flowing in the other transistor. Since the input current is reflected in the output, this circuit, transistors 18 and 20, is referred to as a current mirror. The two transistors in the current mirror will carry the same level of current if they share the same dimensions and the same gate/drain bias voltages.

In order for reference transistor 6 to have a similar source/drain bias to targeted transistor 6, the impedance of current mirror 14 is reduced through operating transistor 18 and 20 in the triode region. Again, instead of operating the transistors 18 and 20 of current mirror 14 in the saturation region, transistors 18 and 20 are forced into the triode region. When transistors 18 and 20 are operated in the triode region, the voltage drop across transistor 18 is reduced to 0.5 volts approximately. With having this 0.5 volts of headroom occupied by transistor 18, the difference between the electric field in the channels of reference transistor 6 and targeted transistor 4 is merely 2 percent. Consequently, active bias current network 2 is able to accurately simulate and compensate for bias current variations in targeted transistor 4 produced by HCI.

In contrast, if transistor 18 was to be operated in the saturation region, transistor 18 would have a voltage drop of 2 to 3 volts. With this 2 to 3 volts of headroom occupied by transistor 18 hypothetically operating in the saturation mode, the difference between the electric field in the channels of reference transistor 6 and targeted transistor 4 is 10 percent. Therefore, operating transistor 18 in the triode region, as taught by the present invention, represents an improvement over operating transistor 18 in the saturation region. Operating transistor 18 in the triode region drops the headroom occupied by transistor 18 from the 2–3 volts used in the saturation region into the sub-volt range, 0.3–0.5 volts.

Figure 2:
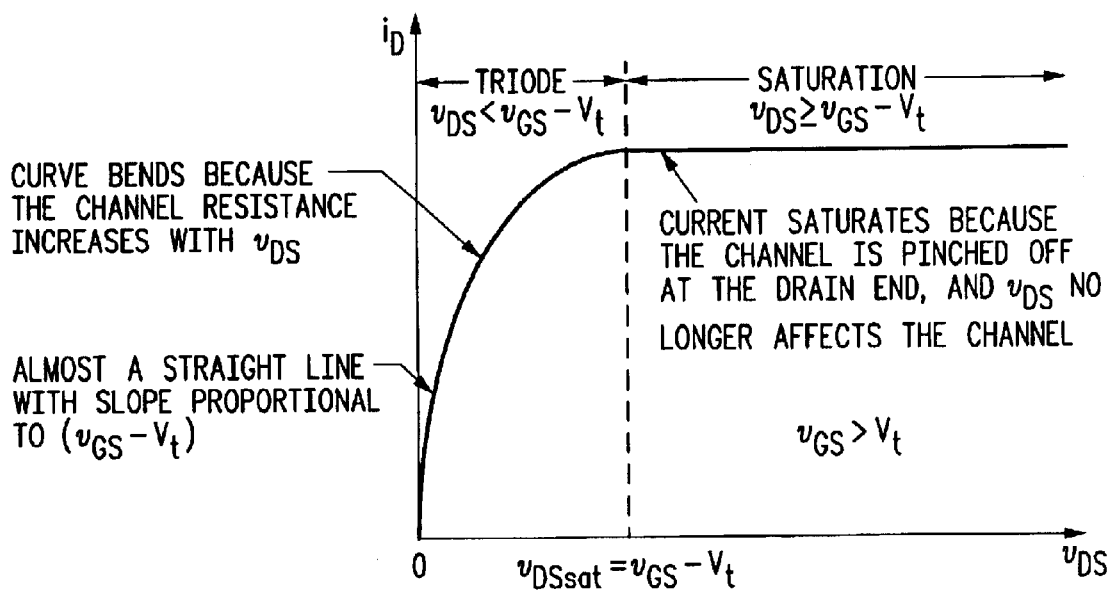
FIG. 2 illustrates a graph of the drain current $i_D$ versus the drain-to-source voltage $v_{DS}$ for an NMOS transistor operated with $v_{GS} > V_t$.

FIG. 2 illustrates a graph of an NMOS transistor operated with $v_{GS} \geq V_t$. In the operation of a MOSFET (Metal Oxide Semiconductor Field Effect Transistor), as depicted in FIG. 2, as $v_{GS}$ is increased above $V_T$ for an NMOS device, a drain current conducts for $v_{DS} > 0$. For $v_{DS} \leq v_{GS} - V_T$, an NMOS device is in the triode mode of operation. In the triode region, the drain current varies with $v_{DS}$. As $v_{DS}$ is increased with $v_{GS} > V_T$ and $v_{DS} \geq v_{GS} - V_T$, the NMOS device operates in the saturation mode. In the saturation mode, the drain current is nearly independent of the drain source voltage $v_{DS}$. $v_{GS}$ is the gate source voltage on an MOS device. $v_{DS}$ is the drain source voltage on an MOS device. $V_T$ is the threshold voltage.

Referring again to FIG. 2, consider the situation where $v_{DS}$ is increased. For this purpose, $v_{GS}$ is held constant at a value greater than $V_T$. Note that $v_{DS}$ is the voltage drop across the length of the channel. That is, traveling along the channel from the source to the drain, the voltage (measured relative to the source) increases from 0 to $v_{DS}$. Thus the voltage between the gate and points along the channel decreases from $v_{GS}$ at the source end to $v_{GS} - v_{DS}$ at the drain end. Since the channel depth depends on this voltage, the channel is no longer of uniform depth; rather, the channel will take the tapered form, being deepest at the source end and shallowest a the drain end. As $v_{DS}$ is increased, the channel becomes more tapered and its resistance increases correspondingly. Thus the $i_D - v_{DS}$ curve does not continue as a straight line but bends as depicted in FIG. 2. Eventually, when $v_{DS}$ is increased to the value that reduces the voltage between gate and channel at the drain end to $V_t$–that is, $v_{GS} - v_{DS} = V_t$ or $v_{DS} = v_{GS} - V_t$–the channel dept at the drain end decreases to almost zero, and the channel is said to be pinched off. Increasing $v_{DS}$ beyond this value has little effect (theoretically, no effect) on the channel shape, and the current through the channel remains constant at the value reached for $v_{DS} = v_{GS} - V_t$. The drain current thus saturates at this value, and the MOSFET is said to have entered the saturation region of operation. The voltage $v_{DS}$ at which saturation occurs is denoted $v_{DSsat}$, $$v_{DSsat} = v_{GS} - V_t$$

For every value of $v_{GS} \geq V_t$, there is a corresponding value of $v_{DSsat}$. The device operates in the saturation region if $v_{DS} \geq v_{DSsat}$. The region of the $i_D - v_{DS}$ characteristic obtained for $v_{DS} < v_{DSsat}$ is called the triode region, a carry-over from the days of vacuum-tube devices whose operation of the FET resembles. The triode region is illustrated in FIG. 2 as the portion of the the $i_D - v_{DS}$ characteristic obtained for $v_{DS} < v_{DSsat}$.

As depicted in FIG. 1, the gate terminals of transistors 18 and 20 are given a constant voltage bias. The operational amplifier 22 and transistor 24, referred to biasing transistor 24, combine to ensure that transistors 18 and 20 have the same voltage drop across the drain/source terminal. Since transistors 18 and 20 share the same bias voltages and same geometry dimensions, the current from transistor 20, current IM3 mirrors changes in current IM2. Current IM2 is therefore equivalent to the bias current of reference transistor 6, which is proportional to the bias current of targeted transistor 4.

The bias current of reference transistor 6 is compared to the current from reference current source 10. Reference current source 10 provides a constant current source independent of temperature, power supply fluctuations, and HCI. The bias current of reference transistor 6 is compared to the current from reference current source 10 using current mirror 16. The transistor pair 26 of current mirror 16 is operated in the saturation region.

Feedback control 12 is a MOS transistor. Feedback control 12 forms a current mirror when combined with reference transistor 6 and target transistor 4. Feedback control 12 adjusts the bias across reference transistor 6 and targeted transistor 4 based upon the comparison of the bias current of reference transistor 6 to the reference current from reference current source 10. Referring again to FIG. 1, IM3 is equivalent to IM2. Current mirror 16 provides that IM4 is equivalent to IM3. Again, the reference current, Iref, is equivalent to the combination of IM5 and IM4.

If the bias current of reference transistor 6 decreases, IM2 also decreases. Consequently, IM3 and IM4 also decrease. Since Iref is a constant, a decreasing IM4 results in an increasing IM5. This increased current IM5 is fed back to reference transistor 6 and targeted transistor 4 through feedback control 12. This fed back current provides corrective compensation to adjust the bias of reference transistor 6 and targeted transistor 4 to restore them to a stable constant bias current level. As a result, the bias current of targeted transistor 4 is maintained at a desired constant level.

If the bias current of reference transistor 6 increases, IM2 also increases. Consequently, IM3 and IM4 also increase. Since. Iref is a constant, a increasing IM4 results in a decreasing IM5. This decreased current IM5 is fed back to reference transistor 6 and targeted transistor 4 through feedback control 12. This fed back current provides corrective compensation to adjust the bias of reference transistor 6 and targeted transistor 4 to restore them to a stable constant bias current level. As a result, the bias current of targeted transistor 4 is maintained at a desired constant level.

In FIG. 1, a preferred embodiment is depicted having MOS transistors. Devices 18, 20 and 24 are PMOS. Devices 4,6,12 and 26 are NMOS. It is desirable that the MOS transistors 4 and 6 are LDMOS transistors due to their superior Radio Frequency (RF) capabilities. LDMOS devices are DMOS devices that have a lateral configuration. DMOS devices are "double diffused" MOS (metal oxide semiconductor) transistor devices. A DMOS device is characterized by a source region and a backgate region, which are diffused at the same time. The transistor channel is formed by the difference in the two diffusions, rather than by separate implantation. DMOS devices have the advantage of decreasing the length of the channel, thereby providing low-power dissipation and high-speed capability. RF Power LDMOS devices are used in high power, single and multi-carrier, RF (radio frequency) amplifiers. These devices amplify the RF carrier at the wide area network's wireless interface. The power gain, output power, efficiency, and linearity of the power amplifier is a major contributor to the Base Transceiver Station (BTS) system's cost and performance.

The present invention is also applicable to bias devices manufactured by other technologies like Bipolar Junction Transistors (BJT), Hetero-Junction Bipolar Transistors (HBT), Metal Semiconductor Field Effect Transistors (MESFET) and High Electron Mobility Transistors (HEMT). In addition, the present invention can be implemented in monolithic circuitry on the microchip or in discrete circuitry external of the microchip. The current sensing transistor 18 that is connected with power supply Vdd should have a high enough breakdown voltage to sustain power supply transient responses.

Referring again to FIG. 1, FIG. 1 depicts current mirror 14 of a preferred embodiment of the present invention having MOS devices 18 and 20. The gate terminals of transistors 18 and 20 are given a constant voltage bias. Instead of operating the transistors 18 and 20 of current mirror 14 in the saturation region, transistors 18 and 20 are forced into the triode region. When transistors 18 and 20 are operated in the triode region, the voltage drop across transistor 18 is reduced to 0.5 volts approximately. Since transistor 18 only has a 0.5 volt loading, there is a minimal change in the loading across reference transistor 6 when compared to target transistor 6. In fact, a 0.5 Volt loading difference between the two transistors 4 and 6 leads to only a 2 percent difference in the electric field concentration in the channel between the source and drain of transistors 4 and 6. Consequently, it is possible to accurately simulate the HCI effect occurring in target transistor 4 with reference transistor 6 when transistors 18 and 20 are operating in the triode region. Since, transistor 18 occupies minimal headroom, reference transistor 6 accurately simulates the HCI induced current variation occurring in target transistor 4.

The operational amplifier 22 and transistor 24 combine to ensure that transistors 18 and 20 have the same voltage drop across the drain/source terminal. More precisely, operational amplifier 22 and transistor 24 are used to control IM3 so that it is equivalent to IM2.

Since transistors 18 and 20 share the same bias voltages and same geometry dimensions, the current from transistor 20, current IM3 mirrors changes in current IM2. Current IM3 is therefore equivalent to the bias current of reference transistor 6, which is proportional to the bias current of targeted transistor 4.

The implementation of the present invention allows device engineering to provide better RF performance of LDMOS devices free of HCI complications. In addition, it is possible to implement active bias current network 2 on the semiconductor chip so that the network 2 is invisible to the final customer. Alternatively, it is possible to implement network 2 utilizing an circuit external to the microchip. In this manner, it is possible to retrofit existing transistors and systems.

Although the present invention has been described in detail, it will be apparent to those of skill in the art that the invention may be embodied in a variety of specific forms and that various changes, substitutions, and alterations can be made without departing from the spirit and scope of the invention. The described embodiments are only illustrative and not restrictive and the scope of the invention is, therefore, indicated by the following claims.

I claim:

1. An active bias current network, comprising:
   a target transistor;
   a reference transistor;
   a current source;
   a current sensor comprising a first current mirror having two transistors biased in the triode region and a second current mirror coupled between said first current mirror and said current source, wherein said second current mirror is comprised of two transistors biased in the saturation region; and a feedback control, said current sensor is coupled to said reference transistor, said current source is connected to said current sensor and said feedback control, said feedback control is coupled to said target transistor and said reference transistor, wherein said feedback control is a transistor coupled to said reference transistor and said target transistor to form a third current mirror.

2. The active bias network of claim 1, wherein said first current mirror is further comprised of an operational amplifier coupled between said two transistors biased in the triode region.

3. The active bias network of claim 1, wherein said first current mirror is further comprised of a biasing transistor coupled to said operational amplifier and said second current mirror.

4. An active bias current network, comprising:
  a target transistor having a bias current;
  reference means to simulate said bias current;
  current sensing means to monitor said bias current, said current sensing means comprising:
    a first current mirror having two transistors biased in the triode region;
    a second current mirror having two transistors biased in the saturation region; and
    constant current means to provide a constant current source; and
  feedback means to adjust a bias of said target transistor and said reference transistor, said current sensing means is coupled to said reference means, said constant current means is connected to said current sensing means and said feedback means, wherein said feedback means is a transistor coupled to said reference means and said target transistor to form a third current mirror.

5. The active bias network of claim 1, further comprising current equalizing means to provide that said two transistors biased in the triode region of said first current mirror each provide an equivalent level of current.

6. The active bias network of claim 5, wherein said current equalizing means is comprised of an operational amplifier coupled between said two transistors biased in the triode region.

7. The active bias network of claim 5, wherein said current equalizing means is further comprised of a biasing transistor coupled to said operational amplifier and said second current mirror.

8. A method for regulating the bias current in a transistor, comprising the steps of:
  replicating a bias current from a target transistor with a reference transistor;
  biasing a first current mirror into a triode region;
  sensing said bias current with said first current mirror;
  comparing said bias current to a reference current;
  determining a current difference between said bias current and said reference current;
  adjusting a bias across said target transistor and said reference transistor using said current difference between said bias current and said reference current;
  equalizing the input and output currents of said first current mirror; and
  buffering the output of said first current mirror from said reference current with a second current mirror.

9. The method of regulating the bias current in a transistor of claim 8, comprising the further step of biasing a pair of transistors forming said second current mirror into a saturation region.

10. An active bias current network for stabilizing the bias current in a target transistor, comprising:
  a reference transistor;
  a first current mirror coupled to said reference transistor, said first current mirror comprising:
    a transistor pair biased in a triode region;
    an operational amplifier having a pair coupled between said transistor pair; and
    a biasing transistor connected to an output of said operational amplifier;
  a second current mirror coupled to said biasing transistor, said second current mirror comprised of a transistor pair biased in a saturation mode;
  a reference current source coupled to said second current mirror; and
  a feedback transistor coupled between said reference current, said second current mirror, and said reference transistor and said target transistor.

11. A method of regulating the bias current in a transistor, comprising the steps of:
  producing a bias reference current;
  varying said bias reference current with hot carrier injection;
  monitoring said bias reference current with a current sensor;
  comparing said bias reference current to a constant reference current;
  determining a current difference between said bias reference current and said constant reference current; and
  adjusting a bias on said transistor using said current difference.

* * * * *

UNITED STATES PATENT AND TRADEMARK OFFICE
CERTIFICATE OF CORRECTION

PATENT NO.    : 6,714,081 B1
DATED         : March 30, 2004
INVENTOR(S)   : Jie J. Xu It is certified that error appears in the above-identified patent and that said Letters Patent is hereby corrected as shown below:

Column 9,
Line 1, delete "claim 1" and replace with -- claim 4 --.

Signed and Sealed this

Twelfth Day of July, 2005

JON W. DUDAS
*Director of the United States Patent and Trademark Office*